(12) United States Patent
Krishnan et al.

(10) Patent No.: US 9,273,413 B2
(45) Date of Patent: Mar. 1, 2016

(54) WAFER CARRIER WITH TEMPERATURE DISTRIBUTION CONTROL

(71) Applicant: Veeco Instruments Inc., Plainview, NY (US)

(72) Inventors: Sandeep Krishnan, Plainview, NY (US); Alexander I. Gurary, Bridgewater, NJ (US); Keng Moy, Basking Ridge, NJ (US)

(73) Assignee: Veeco Instruments Inc., Plainview, NY (US)

( * ) Notice: Subject to any disclaimer, the term of this patent is extended or adjusted under 35 U.S.C. 154(b) by 169 days.

(21) Appl. No.: 13/827,495

(22) Filed: Mar. 14, 2013

(65) Prior Publication Data

US 2014/0261698 A1   Sep. 18, 2014

(51) Int. Cl.
| | | |
|---|---|---|
| C30B 25/12 | (2006.01) | |
| C30B 25/10 | (2006.01) | |
| C23C 16/458 | (2006.01) | |
| C30B 29/40 | (2006.01) | |

(52) U.S. Cl.
CPC ............... *C30B 25/12* (2013.01); *C23C 16/458* (2013.01); *C23C 16/4586* (2013.01); *C30B 25/10* (2013.01); *C30B 29/40* (2013.01); *Y10T 137/0318* (2015.04)

(58) Field of Classification Search
None
See application file for complete search history.

(56) References Cited

U.S. PATENT DOCUMENTS

| | | | |
|---|---|---|---|
| 4,512,841 A | 4/1985 | Cunningham, Jr. et al. | |
| 4,869,801 A | 9/1989 | Helms et al. | |
| 5,318,801 A | 6/1994 | Snail et al. | |
| 5,343,012 A | 8/1994 | Hardy et al. | |
| 5,474,612 A | 12/1995 | Sato et al. | |
| 5,588,827 A | 12/1996 | Muka | |
| 5,679,405 A | 10/1997 | Thomas et al. | |
| 5,782,979 A | 7/1998 | Kaneno et al. | |
| 5,906,684 A | 5/1999 | Tamura et al. | |
| 6,001,183 A | 12/1999 | Gurary et al. | |
| 6,113,702 A | 9/2000 | Halpin et al. | |
| 6,184,154 B1 | 2/2001 | Dietze et al. | |

(Continued)

FOREIGN PATENT DOCUMENTS

| | | |
|---|---|---|
| DE | 102005018161 A1 | 11/2006 |
| JP | H02030695 | 2/1990 |

(Continued)

OTHER PUBLICATIONS

Office Action dated Oct. 24, 2014 for U.S. Appl. No. 12/697,381, filed Dec. 14, 2010.

(Continued)

*Primary Examiner* — Joseph Miller, Jr.
(74) *Attorney, Agent, or Firm* — Patterson Thuente Pedersen, P.A.

(57) ABSTRACT

Wafer carrier arranged to hold a plurality wafers and to inject a fill gas into gaps between the wafers and the wafer carrier for enhanced heat transfer and to promote uniform temperature of the wafers. The apparatus is arranged to vary the composition, flow rate, or both of the fill gas so as to counteract undesired patterns of temperature non-uniformity of the wafers. In various embodiments, the wafer carrier utilizes at least one plenum structure contained within the wafer carrier to source a plurality of weep holes for passing a fill gas into the wafer retention pockets of the wafer carrier. The plenum (s) promote the uniformity of the flow, thus providing efficient heat transfer and enhanced uniformity of wafer temperatures.

16 Claims, 11 Drawing Sheets

(56) References Cited

U.S. PATENT DOCUMENTS

| | | | |
|---|---|---|---|
| 6,203,622 | B1 | 3/2001 | Halpin et al. |
| 6,394,797 | B1 | 5/2002 | Sugaya et al. |
| 6,506,252 | B2 | 1/2003 | Boguslavskiy et al. |
| 6,685,774 | B2 | 2/2004 | Boguslavskiy et al. |
| 6,840,767 | B2 | 1/2005 | Goodman |
| 7,276,124 | B2 | 10/2007 | Gurary et al. |
| 7,601,224 | B2 | 10/2009 | Foree |
| 2002/0106826 | A1 | 8/2002 | Boguslavskiy et al. |
| 2003/0221624 | A1 | 12/2003 | Jurgensen et al. |
| 2003/0233768 | A1 | 12/2003 | Kaeppeler |
| 2004/0055709 | A1 | 3/2004 | Boyd et al. |
| 2004/0123805 | A1 | 7/2004 | Tomoyoshi |
| 2004/0255843 | A1* | 12/2004 | Yoshida et al. ............... 117/89 |
| 2005/0183829 | A1 | 8/2005 | Goodman et al. |
| 2005/0207088 | A1 | 9/2005 | Nishimoto et al. |
| 2007/0081296 | A1 | 4/2007 | Brillhart et al. |
| 2007/0131173 | A1 | 6/2007 | Halpin et al. |
| 2007/0186853 | A1 | 8/2007 | Gurary et al. |
| 2008/0032040 | A1 | 2/2008 | Okabe et al. |
| 2009/0110805 | A1 | 4/2009 | Kaeppeler et al. |
| 2009/0155028 | A1 | 6/2009 | Boguslavskiy et al. |
| 2010/0055318 | A1 | 3/2010 | Volf et al. |
| 2011/0206843 | A1 | 8/2011 | Gurary et al. |

FOREIGN PATENT DOCUMENTS

| | | |
|---|---|---|
| JP | H04024916 | 1/1992 |
| JP | 05013350 | 1/1993 |
| JP | H06021005 | 1/1994 |
| JP | H06283431 | 10/1994 |
| JP | 2000/003879 | 1/2000 |
| JP | 2007/109770 | 4/2007 |
| JP | 2008/252106 | 10/2008 |
| JP | 2009088088 | 4/2009 |
| JP | 2009534824 | 9/2009 |
| WO | WO9709737 | 3/1997 |
| WO | WO9709737 A1 | 3/1997 |
| WO | WO9832893 | 7/1998 |
| WO | WO 9832893 A2 | 7/1998 |
| WO | WO02063074 | 8/2002 |
| WO | WO 2007122147 | 11/2007 |
| WO | WO2011106064 | 9/2011 |
| WO | WO2012139006 | 10/2012 |

OTHER PUBLICATIONS

International Search Report and Written Opinion, PCT/US2010/060258, dated Apr. 28, 2011.
Application and File History of U.S. Appl. No. 12/967,381, filed Dec. 14, 2010, Inventors Gurary et al.
International Preliminary Report on Patentability for International Application No. PCT/US2010/060258, filed Dec. 12, 2010.
U.S. Patent and Trademark Office Action for U.S. Appl. No. 12/967,381 dated May 4, 2015.
IPRP for International Application No. PCT/US2010/060258 dated Oct. 9, 2012.
Taiwanese Office Action for Application No. 100106284 issued Dec. 13, 2013.
Singapore Written Opinion for Application No. 201206198-2 dated Jul. 5, 2013.
Singapore Written Opinion for Application No. 201206198-2 dated Jan. 23, 2014.
Japanese Office Action for Application No. JP2012-554991 dated Jan. 6, 2015.
U.S. Office Action for U.S. Appl. No. 13/827,495 dated Dec. 17, 2014.
Chinese $2^{nd}$ Office Action for Chinese Application No. 201080066401.7 dated Apr. 22, 2015. English Translation Provided.
JP 2012-554991, filed Jun. 30, 2015, Office Action dated Jul. 3, 2015, 2 pages, translation.

* cited by examiner

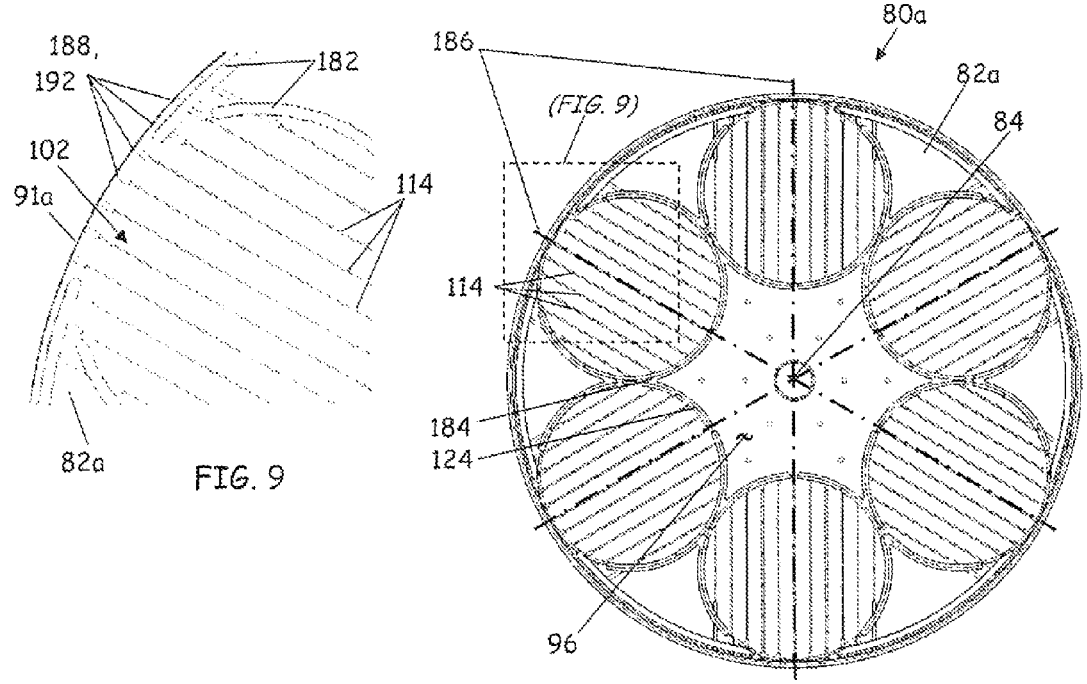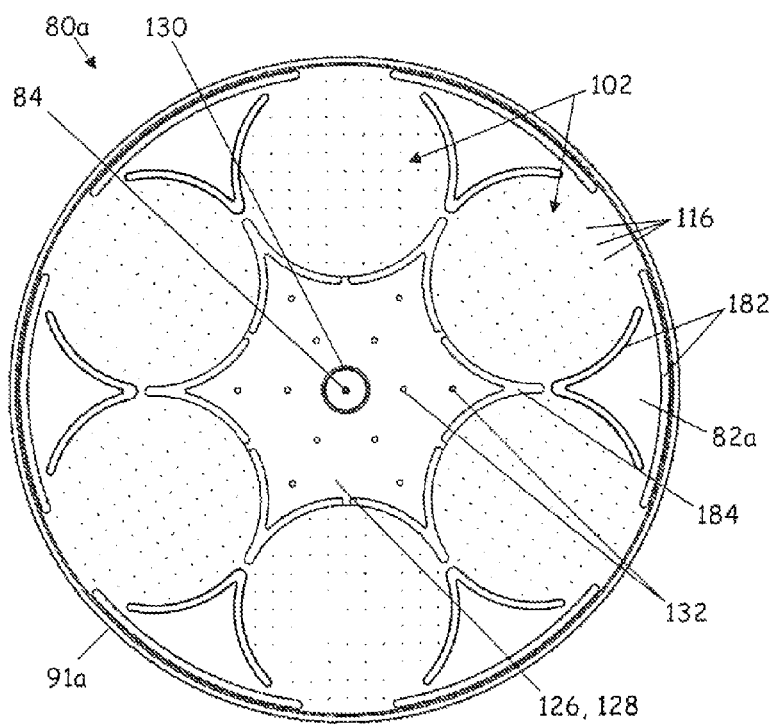

WAFER CARRIER WITH TEMPERATURE DISTRIBUTION CONTROL

FIELD OF THE INVENTION

The invention relates generally to semiconductor fabrication technology and, more particularly, to chemical vapor deposition (CVD) processing and associated apparatus for reducing temperature non-uniformities on semiconductor wafer surfaces.

BACKGROUND OF THE INVENTION

Many semiconductor devices are formed by processes performed on a substrate. For example, in the fabrication of light-emitting diodes (LEDs) and other high-performance devices such as laser diodes, optical detectors, and field effect transistors, a chemical vapor deposition (CVD) process is typically used to grow a thin film stack structure using materials such as gallium nitride over a sapphire or silicon substrate. The substrate typically is slab of a crystalline material, commonly referred to as a "wafer," typically in the form of a disc.

One common process is epitaxial growth. For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 1000-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and band gap of the semiconductor. For example, in a gallium nitride based semiconductor, indium, aluminum or both can be used in varying proportion to vary the band gap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other optoelectronic devices can be fabricated in this way.

The epitaxial growth process can be carried out in a CVD tool that includes a process or reaction chamber, which provides a sealed environment that allows infused gases to be deposited upon the substrate to grow the thin film layers.

One type of CVD tool which has been widely accepted in the industry uses a device commonly referred to as a "wafer carrier." Wafer carriers typically comprise a large disc with numerous wafer retaining regions or "pockets," each pocket adapted to hold one wafer. The wafer retaining pockets are typically comprise a recess or cavity formed on the top surface dimensioned to receive a wafer, and are characterized as having an upwardly-facing floor and a radially inward-facing perimeter wall.

Typically, the wafers are supported by protrusions that extend from the floor and the perimeter wall the wafer retaining pocket to suspend the wafer above the surface of the floor of the wafer retaining pocket. The wafer can bow downward (concave) in different process layers. Suspension above the pocket floor at a predetermined distance prevents wafer from unevenly sitting bottomed out in the pocket due to this shape, which can cause wafer toss and large temperature non-uniformities. Maintaining a certain distance between the wafer and the pocket floor also reduces the wafer temperature non-uniformity that results from an uneven wafer-pocket gap due to the bowing of the wafer. The suspension of the wafer also promotes uniformity of the temperature of the wafer by eliminating random contact points that would otherwise result between the wafer and the pocket floor. Moreover, certain wafer carriers implement pocket floors that are appropriately bowed or shaped to help with uniformity at certain process layers. If the wafer rests on the floor directly, layers that the floors were not designed for can incur large non-uniformities due to bottoming out.

The wafer carrier is supported on a spindle within the reaction chamber so that the top surface of the wafer carrier with exposed surfaces of the wafers is oriented to face upwards, toward a gas distribution element of the CVD tool. While the spindle is rotated, the gas is directed downwardly onto the top surface of the wafer carrier and flows across the top surface toward the periphery of the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

The importance of maintaining uniform conditions at all points on the top surfaces of the various wafers during the CVD process has long been recognized. Minor variations in composition of the reactive gases and in the temperature of the wafer surfaces cause undesired variations in the properties of the resulting semiconductor device. For example, if a gallium and indium nitride layer is deposited, variations in wafer surface temperature will cause variations in the composition and band gap of the deposited layer. Because indium has a relatively high vapor pressure, the deposited layer will have a lower proportion of indium and a greater band gap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

While considerable effort has been devoted to design an optimization of such systems, further improvement would be desirable. In particular, it is desirable to provide better uniformity of temperature across the surface of each wafer.

SUMMARY OF THE INVENTION

Various embodiments of the invention provide a uniform distribution of inert, high conductivity gas, referred to herein as a "fill gas," to a plurality of wafer pockets in a wafer carrier. The uniform distribution of fill gas to the pockets promotes the uniform diffusion of heat transferred between the pocket floors and the wafers to provide efficient heat transfer and enhanced uniformity of temperatures, both across the surface of a given wafer as well as between the plurality of wafers. The fill gas delivered in various embodiments of the invention can have a high conductivity relative to the process gases that would otherwise occupy the interstitial space between the pocket floor and the wafer. The higher conductivity fill gas enhances the heat transfer therebewteen and reduces sensitivity to variations in the thermal conductive coupling.

United States Patent Application Publication No. 2011/0206843 to Gurary et al. (Gurary), assigned to the owner of the instant application, discloses a system that delivers fill gas to a plurality of wafer retaining pockets of a wafer carrier. Each wafer retaining pocket is in fluid communication with a respective conduit that is sourced through the spindle of the CVD tool, and terminates at the face of the pocket floor to define a single exit aperture, preferably at the center of the wafer retaining pocket. It has been found that such an arrangement can cause localized heating or cooling of the wafer at locations immediately above the exit aperture. Localized heating or cooling adversely affects the temperature profile of exposed face of the wafer, and can also cause the wafer to bow slightly due to the presence of thermal gradients.

Various embodiments of the present invention mitigate the effect of localized heating or cooling by delivering the fill gas through a plurality of weep orifices that pass through the floor of the retainer pocket. The "weep orifices" are so named because the flow therethrough is slow enough so as to avoid or reduce convection heat transfer between the wafer and the fill gas. In one embodiment, the weep orifices are distributed in a uniform, matrixical arrangement to promote uniform distribution of the fill gas within the wafer retaining pocket. In order to source the plurality of weep orifices among the plurality of wafer retaining pockets, various plenum configurations and distribution manifold arrangements are implemented to prevent those weep orifices that are closer to the source of the fill gas from starving those weep orifices which are located further from the source of the fill gas.

Structurally, various embodiments of the invention include a wafer carrier for use in a system for growing epitaxial layers on a plurality of wafers by chemical vapor deposition. The wafer carrier can include a body portion formed symmetrically about a central axis, the body portion including generally planar top and bottom surfaces that are substantially perpendicular to the central axis. A plurality of wafer retention pockets can be recessed relative to the top surface of the body portion, each of the wafer retention pockets including a floor portion having an upper surface generally parallel to the top surface of the body portion. A center receptacle can be recessed relative to the bottom surface of the body portion, the center receptacle being concentric with the central axis. In one embodiment, a plurality of flow passages extending radially outward from and are in fluid communication with the center receptacle. At least one plenum chamber can be defined within the body portion, the at least one plenum chamber being in fluid communication with at least one of the plurality of flow passages. In certain embodiments, a plurality of manifold passages are in fluid communication with the at least one plenum chamber, the manifold passages having an orientation that is substantially parallel with the top surface of the body portion of the wafer carrier and extending underneath the surface of the floor portion of one of the plurality of wafer retention pockets. A plurality of weep orifices are formed in the floor portion of the one of the plurality of wafer retention pockets, each of the weep orifices being in fluid communication with one of the plurality of manifold passages and passing through the upper surface of the floor portion of the wafer retention pocket. The weep orifices can be oriented substantially parallel with the central axis. The plurality of manifold passages can be parallel to each other.

In one embodiment, the plenum chamber or chambers can be characterized as having a first hydraulic diameter and each of the manifold passages have a second hydraulic diameter, the first hydraulic diameter being about 2 to about 100 times the second hydraulic diameter. The manifold passages can have a second hydraulic diameter and each of the weep orifices have a third hydraulic diameter, the second hydraulic diameter being the same to about 50 times the third hydraulic diameter. Each of the wafer retention pockets can be at least partially surrounded by a thermal isolation slot, the thermal isolation slot being defined in and recessed from the bottom surface of the wafer carrier.

The at least one plenum chamber can be a single plenum chamber is centrally located within the body portion and symmetric about the central axis, wherein the single plenum chamber is defined by a plenum cavity formed in a central region of the body portion and a closure portion disposed within the plenum cavity, the plenum cavity being in fluid communication with the plurality of manifold passages. In one embodiment, the cavity is recessed from the bottom surface of the body portion. In another embodiment, the single plenum chamber is defined by a two-piece plenum structure, the two-piece plenum structure being disposed within the body portion of the wafer carrier.

Alternatively, the wafer carrier can include a plurality of distributed plenum chambers, each being associated with a respective one of the wafer carrier pockets. Each plenum chamber can surround the wafer pocket, the plenum chamber providing thermal isolation of the wafer pocket from a body portion of the wafer carrier.

In another embodiment of the invention, a method for controlling the temperature distribution in a wafer carrier includes providing a wafer carrier that defines a central axis and includes a wafer pocket, the wafer pocket being in fluid communication with a plurality of weep orifices, each of the plurality of weep orifices being in fluid communication with a plenum chamber, the plenum chamber being contained within the wafer carrier and in fluid communication with a center receptacle, the center receptacle being concentric about the central axis; and charging the plenum chamber with a fill gas via the center receptacle, thereby causing the fill gas to enter the wafer pocket via the plurality of weep orifices.

BRIEF DESCRIPTION OF THE DRAWINGS

FIG. 8 is a plan sectional view of the wafer carrier of FIG. 3, the cross-section being parallel to the upper surface of the body and at the axial location of the manifold passages;

FIG. 9 is an enlarged, partial view of the plan sectional view of FIG. 8;

FIG. 10 is a plan sectional view of the wafer carrier of FIG. 3, the cross-section being parallel to the upper surface of the body and at an axial location between the manifold passages and the upper surface of the floor portions;

DETAILED DESCRIPTION

Figure 2:
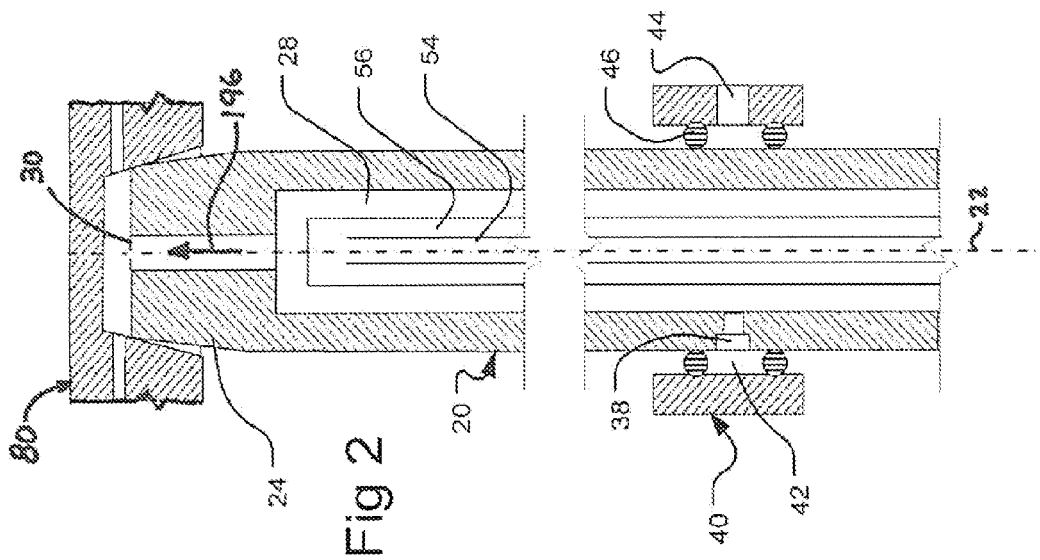
FIG. 2 is a partial sectional view of a spindle fitted to a wafer carrier in an embodiment of the invention.
Figure 1:
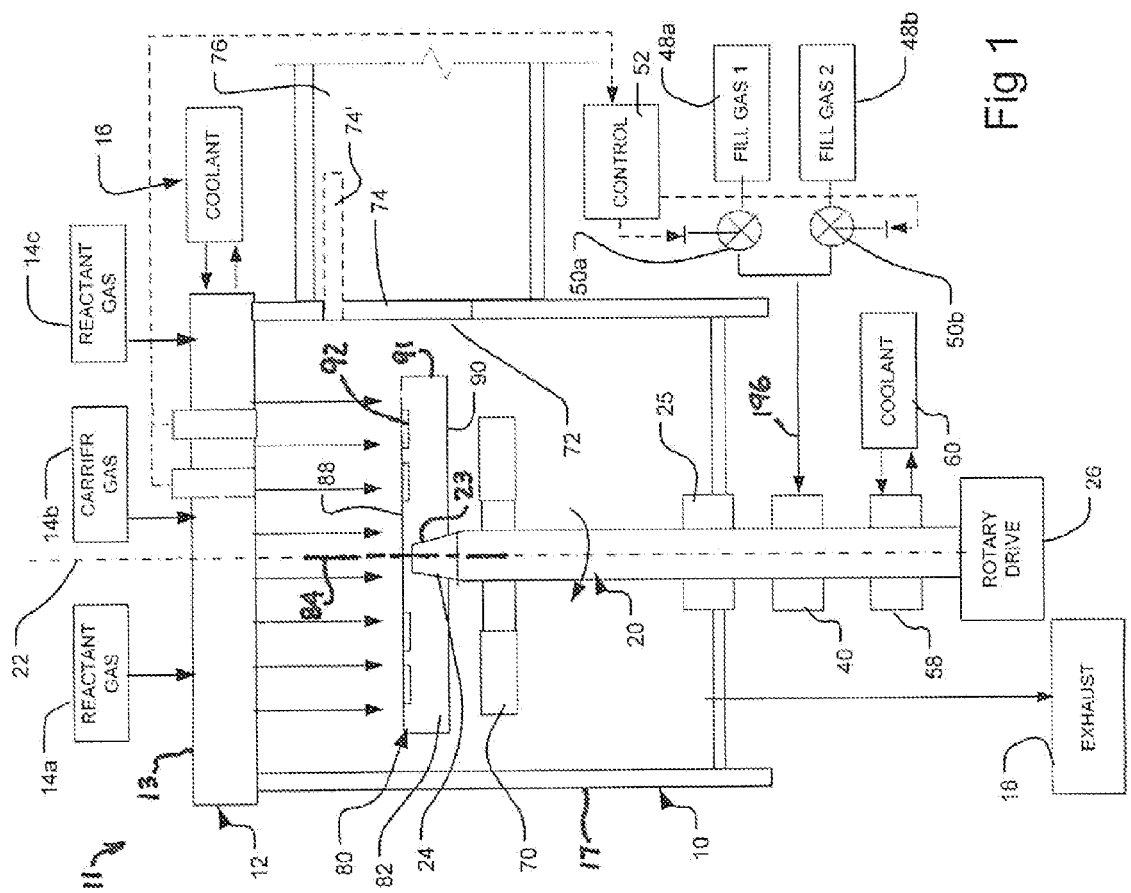
FIG. 1 is a schematic of a CVD apparatus in an embodiment of the invention.

Referring to FIGS. 1 and 2, a schematic of a chemical vapor deposition (CVD) apparatus 11 is depicted an embodiment of the invention. The CVD apparatus 11 includes a reaction chamber 10 having a gas distribution element 12 arranged at a top end 13 of the reaction chamber 10. In certain embodiments, the gas distribution element 12 is connected to sources 14a, 14b, 14c for supplying process gases to be used in the wafer treatment process, such as a carrier gas and reactant gases such as a metalorganic compound and a source of a group V metal. The gas distribution element 12 is arranged to receive the various gases and direct a flow of process gasses generally in the downward direction. The gas distribution element 12 can also be connected to a coolant system 16 arranged to circulate a liquid through the gas distribution element 12 so as to maintain the temperature of the element at a desired temperature during operation. A similar coolant arrangement (not depicted) can be provided for cooling walls 17 of reaction chamber 10. The reaction chamber 10 can also equipped with an exhaust system 18 arranged to remove spent gases from the interior of the chamber through ports (not depicted) at or near the bottom of the chamber so as to permit continuous flow of gas in the downward direction from the gas distribution element 12.

In the depicted embodiment, a spindle 20 is arranged within the chamber so that a rotational axis 22 of the spindle 20 extends in the upward and downward directions. The spindle 20 can be mounted to the reaction chamber 10 by a conventional rotary pass-through device 25 that incorporates bearings and seals (not depicted) for rotation of the spindle 20 about the rotational axis 22, while maintaining a seal between the spindle 20 and the reaction chamber 10. The spindle 20 has a fitting portion 24 at a top end 23, the fitting portion 24 being adapted to releasably engage a wafer carrier. In the depicted embodiment, the fitting portion 24 is a generally frustoconical, tapering toward the top end 23 of the spindle 20. The spindle 20 can be connected to a rotary drive mechanism 26 such as an electric motor drive, which is arranged to rotate the spindle about axis 22. In some embodiments, the spindle 20 has an internal gas passageway 28 terminating at an opening 30 at the top end 23 of the spindle 20 and within fitting portion 24 (FIG. 2).

In one embodiment, the spindle 20 has a gas entry port 38 in fluid communication with the gas passageway 28, the gas entry port 38 being remote from the upper end of the spindle and being below the chamber 10 and the pass-through 25. A rotary connection assembly 40 can define an annular space 42 surrounding the gas entry port 38, so that the port 38 remains in communication with annular space 42 during rotation of the spindle 20. The rotary connection assembly 40 can include an inlet 44 communicating with the annular space 42 and hence with the gas entry port 38 and gas passageway 28 of the spindle. The rotary connection assembly 40 can also include conventional seals 46. Although the seals 46 are diagrammatically depicted as O-rings, the seals may be of any type available to the artisan, such as a lip seal or packing gland.

In various embodiments, the inlet 44 of the rotary connection assembly 40 is connected to fill gas supply sources 48a and 48b (FIG. 1), arranged to supply different gas components having different thermal conductivities. Flow control elements 50a and 50b are provided in the depicted embodiment to regulate the flow of gas from each of sources 48a and 48b independently. The flow control elements 50a, 50b can be connected to signal outputs of a control system 52. In one embodiment, the flow control elements 50a and 50b are arranged for adjustment during operation in response to control signals applied by the control system 52. For example, flow control elements 50a and 50b can be conventional electrically-controllable valves or mass flow controllers provided in the connections between the rotary connection assembly 40 and the sources 48a and 48b. However, any other arrangement for regulation of flow from a gas source in response to a control signal can be utilized.

The spindle 20 can also be provided with internal coolant passages 54 and 56 (FIG. 2) extending generally in the axial direction of the spindle 20 within gas passageway 28. The internal coolant passages 54 and 56 can be connected to a coolant source 60 via a second rotary connection assembly 58 (FIG. 1). A fluid coolant can be circulated in a loop through the coolant passages 54 and 56, originating and returning to the coolant source 60. The coolant source 60 can include conventional devices for regulating the flow and maintaining the temperature of the circulating coolant.

Various embodiments of the invention include heating elements 70 mounted within the reaction chamber 10 which surrounds the spindle 20 below the fitting portion 24. The reaction chamber typically includes an entry opening 72 leading to an antechamber 76, and a door 74 for closing and opening the entry opening. The door 74 is depicted schematically in FIG. 1 as movable between the closed position (solid lines) and an open position 74' (broken lines). In the closed position, the door 74 isolates the interior of the reaction chamber 10 from antechamber 76. The door 74 can equipped with control and actuation devices for movement between the open position and closed positions. In practice, the door 74 can comprise a shutter movable in the upward and downward directions as disclosed, for example, in U.S. Pat. No. 7,276,124. The CVD apparatus 11 can further include a loading mechanism (not depicted) for moving a wafer carrier from the antechamber 76 into the reaction chamber 10, engaging the wafer carrier with the spindle 20 in the operative condition, and for moving a wafer carrier off of the spindle 20 and into the antechamber.

A wafer carrier 80 is mounted to the spindle 20 in an operative position. The wafer carrier 80 includes a body 82 which can be substantially circular about a central axis 84. The body 82 is characterized as having a generally planar top surface 88, a generally planar bottom surface 90, and an outer peripheral edge 91. The top and bottom surfaces 88 and 90 can extend generally parallel to each other and can be generally perpendicular to the central axis 84 of the body 82. The body 82 also has a plurality of wafer retention pockets 92, each adapted to hold a corresponding one of a plurality of wafers 94.

Various configurations of the wafer carriers 80 of the present invention are described below.

Referring to FIGS. 3-10, a two-piece wafer carrier 80a comprising a body portion 82a and a closure portion 98 is depicted in an embodiment of the invention. The body portion 82a defines a plurality of wafer retention pockets 92a recessed from a top surface 88a. The body portion 82a further comprises a plenum cavity 96 recessed from a bottom surface 90a. The closure portion 98 is disposed within the plenum cavity 96 to define a plenum chamber 100 within the two-piece wafer carrier 80a.

Each wafer retention pocket 92a includes a floor portion 102 and a peripheral wall 104. The floor portion 102 is characterized as having a thickness 106 and an upper surface 108 facing in the upward direction. A plurality of protrusions 112 extend in the upward direction from the upper surface 108 and radially inward from the peripheral wall 104. The protrusions 112 can be configured and distributed about the periphery of the wafer retention pocket 92a as described in U.S. patent application Ser. No. 13/450,062, filed on Apr. 18, 2012 and owned by the owner of the present application.

The floor portion 102 of a given wafer retention pocket 92a includes a plurality of manifold passages 114 that extend into the thickness 106 of the floor portion 102 substantially parallel to the upper surface 108. A plurality of weep orifices 116 extend in the upward direction from each of the manifold passages 114, passing through the upper surface 108 of the floor portion 102, thereby establishing fluid communication between the wafer retention pocket 92a and the respective manifold passage 114.

Figure 7:
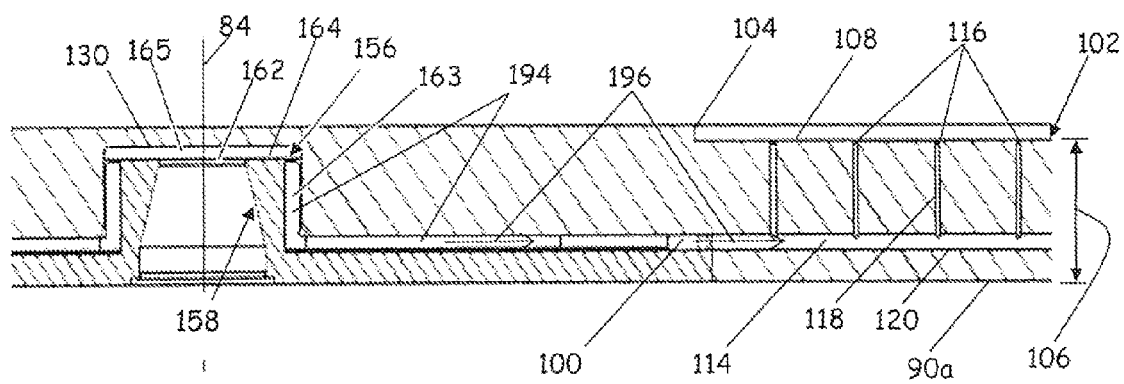
FIG. 7 is an enlarged partial sectional view of the two-piece wafer carrier of FIG. 7.

Flow passageways, such as the weep orifices 116, manifold passages 114 and plenum chambers (discussed below) can be characterized as having hydraulic diameters $D_H$, defined as $$D_H = 4 \cdot A/P \qquad \text{Eq. (1)}$$

where A is the cross-sectional area of the flow passageway and P is the wetted perimeter of the flow passageway. The hydraulic diameters of the weep orifices 116 and manifold passages 114 are denoted by numerical references 118 and 120, respectively (FIG. 7). The hydraulic diameters 118 of the weep orifices 116 can be of substantially smaller dimension than the hydraulic diameters 120 of the manifold passages 114. In a non-limiting example, the weep orifices 116 have a diameter on the order of 0.6 mm (0.025 inches), whereas the manifold passages 114 have a diameter on the order of 1.5 mm (0.06 inches). In various embodiments, the ratio of the hydraulic diameter 120 of the manifold passage 114 to the hydraulic diameter 118 of the weep orifices 116 is in the range of about 1 to about 50.

The manifold passages 114 can be substantially parallel with respect to each other and spaced apart at uniform intervals. Likewise, the weep orifices 116 can be uniformly spaced along the respective manifold passage 114. In such an arrangement, the weep orifices 116 define a matrixical arrangement on the upper surface 108 of the floor portion 102. In the depicted embodiment, the manifold passages 114 and the weep orifices 116 of each of the manifold passages 114 are spaced at a substantially equal dimension, thereby defining a square matrixical arrangement.

Figure 16:
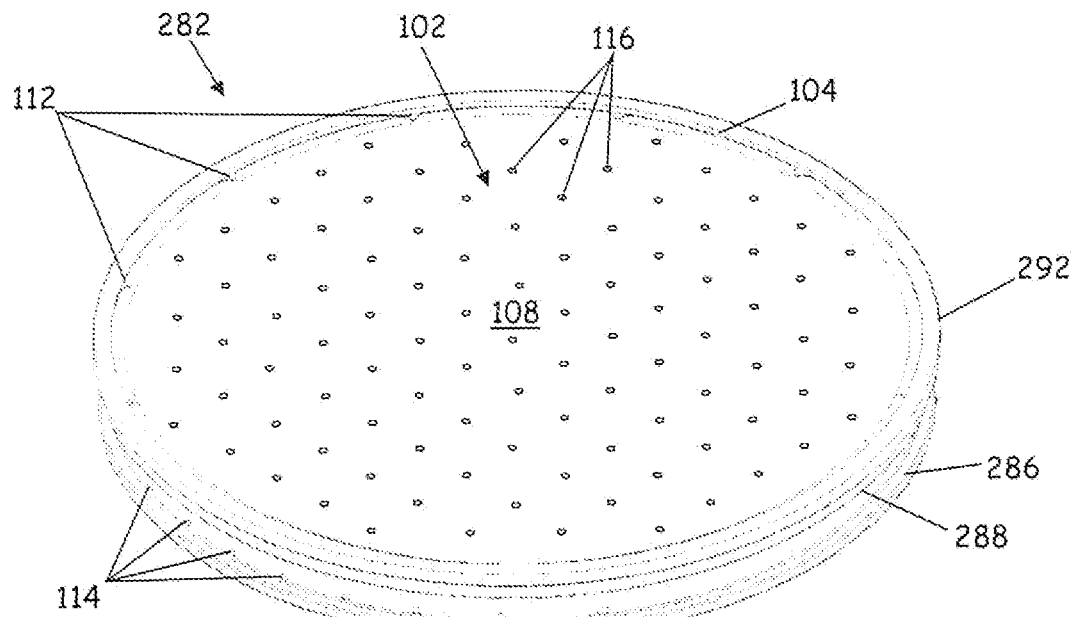
FIG. 16 is an isometric view of a wafer retention pocket of the multiple plenum wafer carrier of FIG. 15.
Figure 16A:
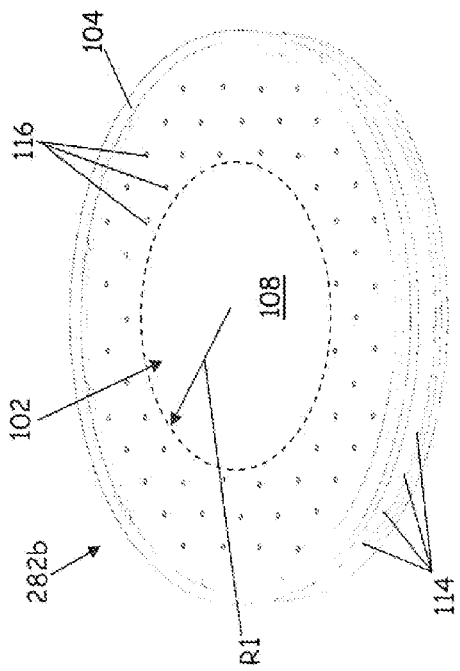
FIGS. 16A through 16C are isometric views of alternative wafer retention pockets in embodiments of the invention.
Figure 16B:
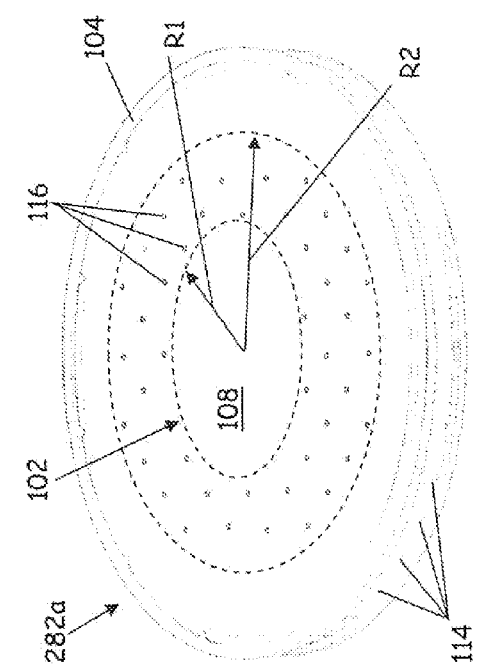
Figure 16C:
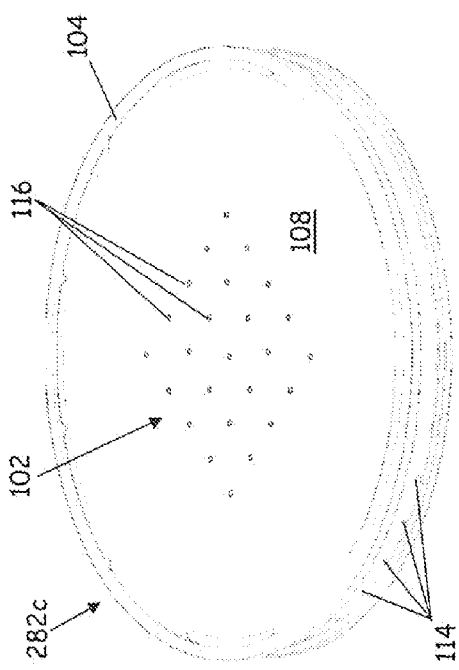
Figure 17:
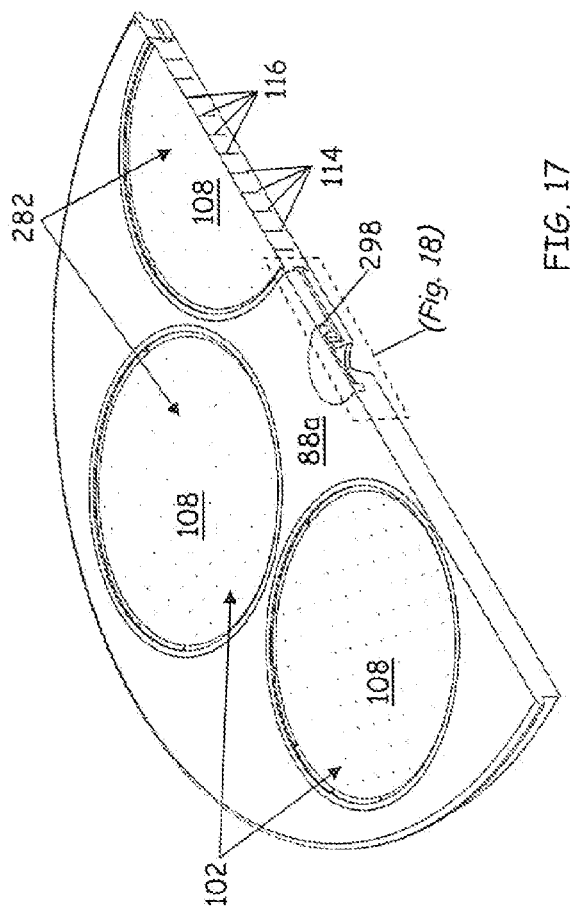
FIG. 17 is an isometric sectional view of the multiple plenum wafer carrier of FIG. 15.

Alternatively, the weep orifices 116 can be in other than a matrixical arrangement or otherwise non-uniformly spaced (FIGS. 16A through 16C). For example, the weep orifices 116 can be arranged in a series of concentric circular patterns in between certain limiting radii on the pocket. Alternatively, they can be of different densities in different sections of the pocket.

Figure 3:
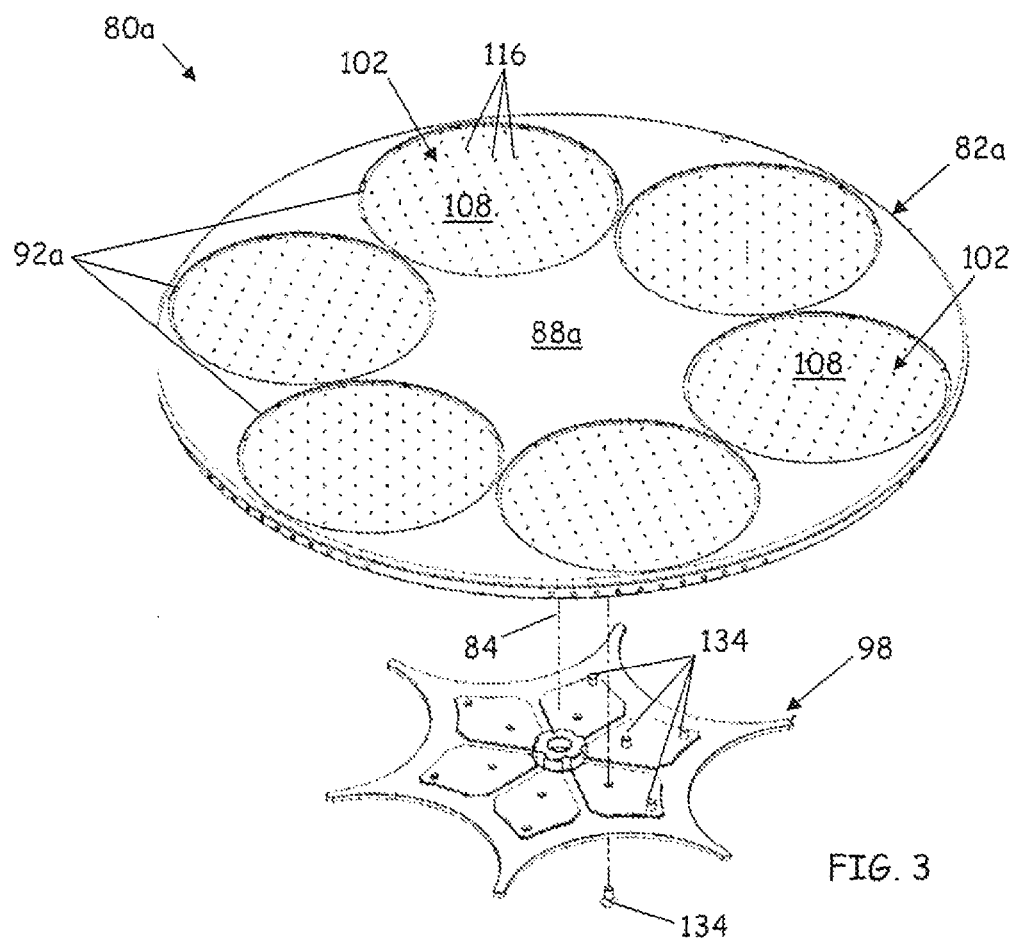
FIG. 3 is an exploded isometric view of the top of a two-piece wafer carrier in an embodiment of the invention.
Figure 4:
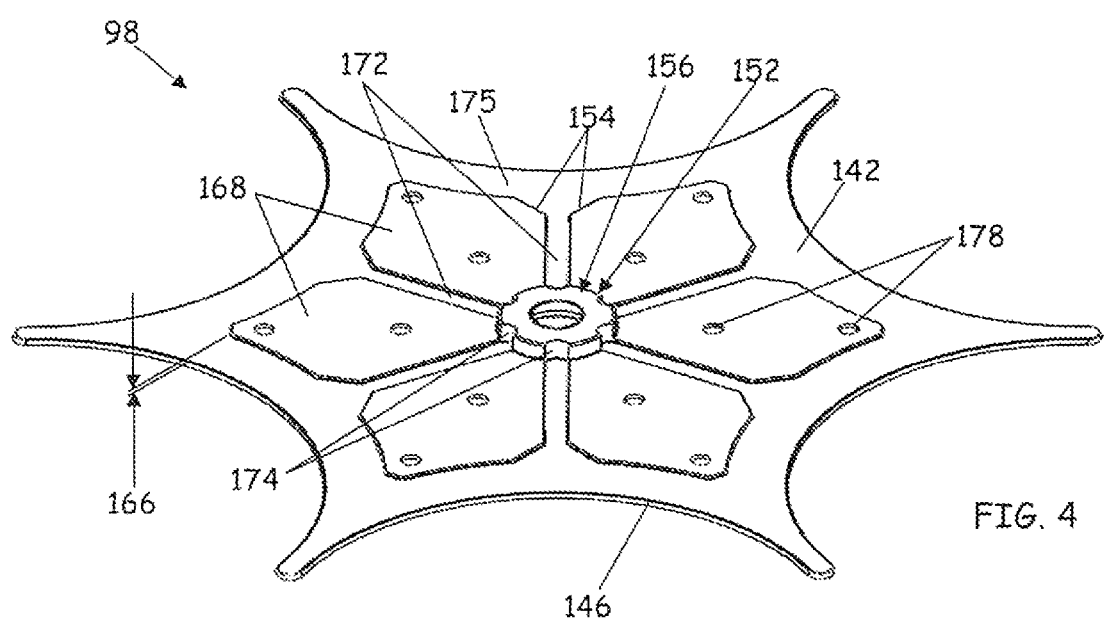
FIG. 4 is an isometric view of a closure portion of the two-piece wafer carrier of FIG. 3 in isolation.
Figure 5:
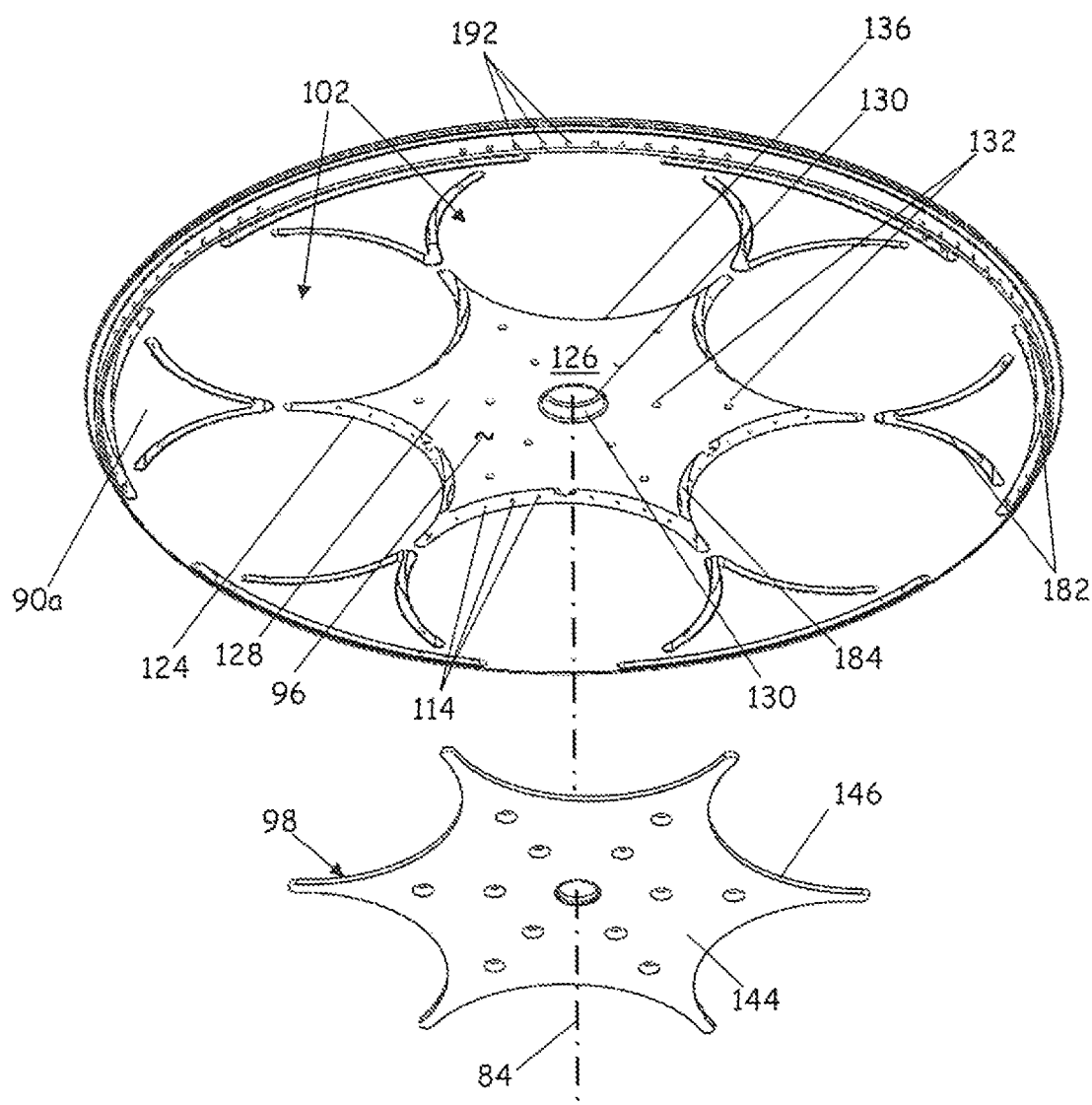
FIG. 5 is an exploded isometric view of the bottom of the two-piece wafer carrier of FIG. 3.
Figure 6:
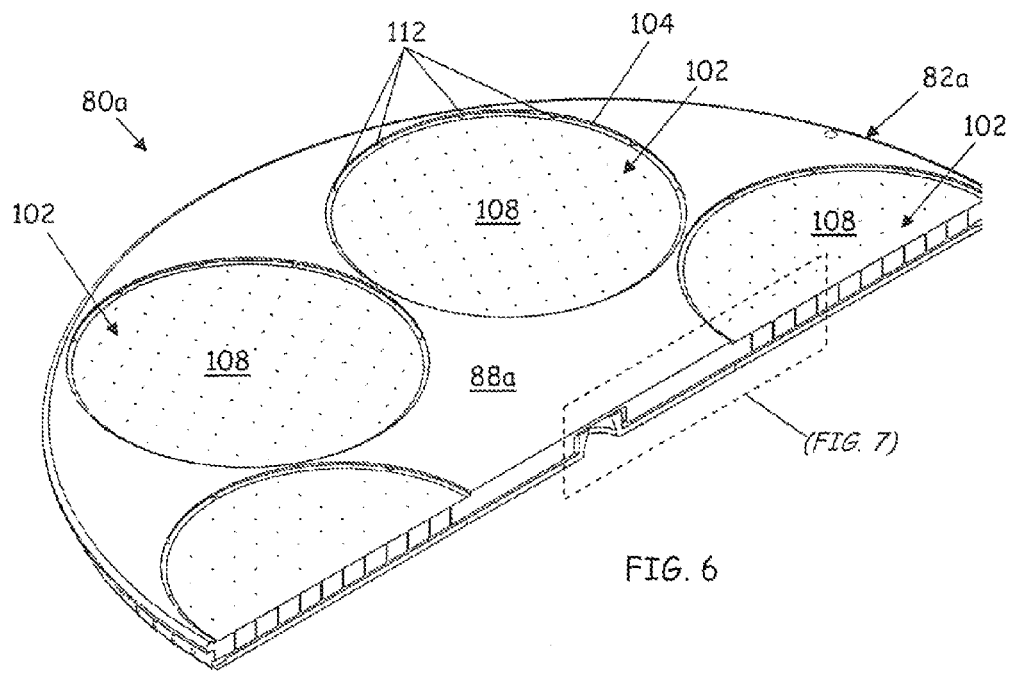
FIG. 6 is an isometric sectional view of the two-piece wafer carrier of FIG. 3.

The plenum cavity 96 of the two-piece wafer carrier 80a is recessed into the body portion 82a from a bottom surface 90a. The plenum cavity 96 is characterized as having a perimeter wall 124 and a ceiling portion 126, the ceiling portion 126 having a lower surface 128. The body portion 82a can further define a center receptacle 130 concentric with the central axis 84 and extending upward from the lower surface 128 of the ceiling portion 126. In the depicted embodiment, the center receptacle is blind (i.e., does not pass through the top surface 88a of the body portion 82a). A plurality of threaded holes 132 (FIG. 5) can be formed on the ceiling portion 126, the threaded holes 132 being configured to receive fasteners 134 (FIG. 3). In one embodiment, the threaded holes 132 are blind so as not to disturb the upper surface 88a of the body portion 82a. The perimeter wall 124 defines exposed edges 136 of the floor portions 102 of the wafer retention pockets 92a. In one embodiment, each of the manifold passages 114 of the various wafer retention pockets 92a are oriented to pass through the exposed edges 136 of the respective floor portion 102, thereby establishing fluid communication between the plenum cavity 96 and the wafer retention pockets 92a via the manifold passages 114 and weep orifices 116.

The closure portion 98 of the two-piece wafer carrier 80a includes an upper face 142, a lower face 144 and a periphery 146. The periphery 146 is shaped to the contour of the perimeter wall 124 of the plenum cavity 96, such that the closure portion 98, when disposed in the plenum cavity 96, provides a close tolerance fit with the perimeter wall 124 of the plenum cavity 96. In one embodiment, the closure portion 98 can include a thin lip running along the periphery 146 that mates with recessed shoulders formed on the exposed edges 136 of the floor portions 102 of the wafer retention pockets 92a. The lip and the shoulders can be dimensioned to overlap when fitted together, providing a mating fit.

In the depicted embodiment, the closure portion 98 includes a hub portion 152 and a plurality of spacer portions 154, all extending upward from the upper face 142 of the closure portion 98. The hub portion 152 includes an exterior surface 156 and an interior surface 158 defining an aperture 162 that passes through a top face 164 of the exterior surface 156. The exterior surface 156 can be dimensioned for a close tolerance fit with the center receptacle 130 of the body portion 82a. In one embodiment, an outer radial face 163 of the exterior surface 156 of the hub portion 152, when fully engaged with the fitting portion 24, extends only partway into the length of the center receptacle 130, thereby defining a gap 165 between the top face 164 of the hub portion 152 and the center receptacle 130. The interior surface 158 of the hub portion 52 can be configured to mate with the fitting portion 24 of the spindle 20 (e.g., complementary to the frustoconical or other shape of the fitting portion 24).

The spacer portions 154 are characterized as having substantially equal thicknesses 166 (FIG. 4) and each defining a raised face 168, the raised faces 168 lying substantially on a common plane. In one embodiment, the spacer portions 154 are of equal shape, and extend radially outward from and are uniformly distributed about the hub portion 152. The distribution of the spacer portions 154 define plurality of channels 172 between the spacer portions 154, the channels 172 extending radially outward from the hub portion 152 to a peripheral portion 175 of the closure portion 98 that extends radially beyond the spacer portions 154.

A plurality of slots 174 can be formed on the outer radial face 163 of the exterior surface 156 of the hub portion 152, the slots 174 extending axially (i.e., parallel to the central axis 84) and each being adjacent a radially proximal end of a respective one of the channels 172. The closure portion 98 can further include a plurality of through holes 178 arranged to align with the threaded holes 132 of the body portion for insertion of the fasteners 134 therethrough.

In one embodiment, the floor portions 102 are partially surrounded by thermal isolation slots 182 and 184 that extend in the upward direction from the bottom surface 90a and the ceiling portion 126, respectively. The thermal isolation slots 182, 184 extend into the body portion 82a but need not pass through the top surface 88a of the body portion, thereby leaving the top surface 88a structurally undisturbed.

In fabrication, the body portion 82a of the two-piece wafer carrier 80a can be initially formed as a blank circular disk having the parallel top and bottom surfaces 88a and 90a and an outer peripheral edge 91a. A plurality of reference axes 186 are designated that extend through and perpendicular to the central axis 84, and which can be uniformly distributed about the central axis 84. The axial location of the reference axes 186 (i.e., the location along the central axis 84 where the reference axes 186 intersect) corresponds to the axial location where the manifold passages 114 are to pass through the floor portions 102 of the wafer retention pockets 92a. Each of the wafer retention pockets 92a is designated to be laterally centered about a corresponding one of the reference axes 186. In the depicted embodiment, for each wafer retention pocket 92a, the manifold passages 114 passing therethrough includes a designated central manifold passage 114' (FIG. 9) that is formed along the respective reference axis 186 with other manifold passages 114 for the corresponding wafer retention pocket 92a being formed parallel to and at the same axial location as the respective reference axis 186.

The manifold passages 114 can be bored from the outer peripheral edge 91a, extending toward the center of the body portion 82a. The length any one of the respective manifold passages 114 is typically long enough to pass through the location of where the perimeter wall 124 of the plenum cavity 96 is or will be formed. In one embodiment, each of the manifold passages 114 include an enlarged diameter portion 188 proximate the outer peripheral edge 91a. For those manifold passages 114 that lie along an axis that passes through a thermal isolation slot 182, the enlarged diameter portion 188 of a given manifold passage 114 extends far enough into the body portion 82a to entirely pass through the location where the thermal isolation slots 182 are or will be formed. Accordingly, the depth (distance into the body from the outer peripheral edge 91a) of the enlarged diameter portions 188 varies with the location of the respective manifold passage 114 with respect to the closest reference axis 186. After forming the enlarged diameter portions 188, plugs 192 can be inserted into the enlarged diameter portions 188 that extend substantially the entire length of the respective enlarged diameter portion 188. The plugs prevent fill gas from exiting the ends of the manifold passages 114 in operation.

After the manifold passages 114 have been formed and the plugs 192 inserted, the weep orifices 116 and the wafer retention pockets 92a are formed from the top surface 88a of the body portion 82a, the weep orifices 116 extending into manifold passages 114. The plenum cavity 96, center receptacle 130, threaded holes 132 and thermal isolation slots 182 and 184 are formed from the bottom surface 90a.

Other than forming the various aspects of the body portion 82a after formation and plugging of the manifold passages 114, there is no particular sequence to their formation. Likewise, the features and aspects of the closure portion 98 can be formed using standard machine practices, again without particular sequence.

In assembly, the closure portion 98 is aligned with and disposed within the complementary-shaped plenum cavity 96 so that the raised faces 168 of the spacer portions 154 register against the ceiling portion 126 of the plenum cavity 96, and secured in place with the fasteners 134. The hub portion 152 is thereby disposed within the center receptacle 130 of the body portion 82a to define the gap 165, the gap 165 being in fluid communication with the gas passageway 28 of the spindle 20. The slots 174 formed on the outer radial face 163 of the hub portion 152 cooperate with the interior surface of the center receptacle 130 and the channels 172 and the peripheral portion 175 of the upper face 142 of the closure portion 98 cooperate with the ceiling portion 126 of the plenum cavity 96 to define a plurality of flow passages 194 that extend from the gap 165 to the plenum chamber 100.

Thus, the plenum chamber 100 of the two-piece wafer carrier 80a is bounded by the ceiling portion 126 and perimeter wall 124 of the plenum cavity 96 and peripheral portion 175 of the upper face 142 of the closure portion 98, with the plurality of flow passages 194 leading thereto. The plenum chamber 100 is thus continuous in the tangential direction and has a height substantially the same as the thickness 166 of the spacer portions 154.

After the closure portion 98 is secured to the body portion 82a, the exterior surfaces of the assembled two-piece wafer carrier 80a can be coated with a material such as silicon carbide using a CVD process to resist the chemicals of the intended environment of operation.

The treated surface exterior surface can have a thermal expansion coefficient that is different from that of the base material (e.g., SiC has a different thermal expansion coefficient than graphite). The difference in thermal expansion can cause the components to bow at temperatures that depart from the treatment temperature, particularly the peripheral portion 175 of the closure portion 98 because of the thinness of the material. Accordingly, in one embodiment, all exposed surfaces of the closure portion 98 (the upper face 142, spacer portions 154 and exterior surface 156 of the hub portion 152) can be coated prior to assembly.

Functionally, with both sides coated evenly, the differential expansion and contraction between the sides reduces bending due to differences in the coefficient of thermal expansion at temperatures different from the treatment temperature. The exterior surface 144 can also be masked during coating of the rest of the two-piece assembly. In this manner, after cool down following the treatment and coating of the entire assembly, the relatively thin peripheral portion of 175 of the closure portion 98 experiences the same thermal contraction on both sides, largely cancelling the bowing effect that would otherwise result from having a treated surface on only one side.

In operation, the wafers 94 are loaded into the two-piece wafer carrier 80a, and the wafer carrier 80a coupled to the fitting portion 24 of the spindle 20. A fill gas 196 from one or both of the gas sources 48a and 48b is caused to flow into the gas passageway 28 via the rotary connection assembly 40, wherefrom the fill gas 196 passes through the gap 165 and flow passages 194 and into the plenum chamber 100. From the plenum chamber 100, the flow of fill gas 196 pressurizes the plurality of manifold passages 114 so that the fill gas 196 flows through the plurality of weep orifices 116 to fill the voids between the upper surfaces 108 of the floor portions 102 of the wafer retention pockets 92 and the plurality of wafers 94. The fill gas 196 exits the two-piece wafer carrier 80a around the perimeters of the wafers 94.

The heater elements 70 are energized and transfer heat to the bottom surface 90a of the two-piece wafer carrier 80a, primarily by radiative coupling. The heat transferred to the bottom surface 90a of the two-piece wafer carrier 80a flows upwardly through the body portion 82a, primarily by conduction through the solid portions and gases, contact conductance across the contacting surfaces (e.g., between the spacer portions 154 and the ceiling portion 126) radiation across the internal spaces (e.g., the plenum chamber 100 and flow passages 194) and by convection, conduction and advection to the fill gas 196. Heat is radiated from the top surface 88a of the two-piece wafer carrier 80a and from the top surfaces of the wafers 94 to the lower temperature components that surround the two-piece wafer carrier 80a (e.g., the walls of the reaction chamber 10), and by advection to the process gas that flows out of the gas inlet element 12 and over the top surface 88a of the two-piece wafer carrier 80a and the top surfaces of the wafers 94. The temperature at the top surfaces of the wafers 94 represents a balance between the heat transfer to the wafers 94 (primarily between the floor portions 102 of the wafer retention pockets 92a) the heat transfer away from the top surface of the wafer 94.

Functionally, the relative cross-sectional flow areas of the plenum chamber 100, manifold passages 114 and weep orifices 116 are such that the uniformity of the flow exiting the weep orifices 116 is enhanced. That is, the effective cross-sectional flow area of the plenum chamber 100 is substantially greater than the combined cross-sectional flow area of the manifold passages 114. Accordingly, the uniformity of a pressure distribution throughout the plenum chamber 100 is promoted throughout for better sourcing of the manifold passages 114 with fill the gas 196. Likewise, the cross-sectional flow area of a given weep orifice 116 is substantially less than the cross-sectional flow area of the manifold passage 114, so that manifold passage 114 does not experience a substantial pressure difference along its length; thus, the weep orifices 116 proximate the inlet to the manifold passage 114 do not starve the weep orifices 116 distal to the inlet.

Because of the convective and advective heat transfer between to the fill gas 196 and the floor portions 102 of the wafer retention pockets 92, the operating temperature of the floor portions 102 can be substantially different than the temperatures of the portions of the two-piece wafer carrier 80a adjacent thereto. The thermal isolation slots 182, 184 act to inhibit heat transfer between the floor portions 102 and the adjacent areas, thus promoting the uniformity of the temperature of the wafer retention pockets 92. The design and influence of the thermal isolation slots is further described at U.S. patent application Ser. No. 13/618,799, filed on Aug. 29, 2012 and owned by the assignee of the instant application.

The flow rate of the fill gas 196 is preferably low enough so that the back pressuring does not cause the wafers 94 to lift off of the protrusions 112. The low flow rate also mitigates convective coupling on the backside of the wafers 94, so that the heat transfer between the floor portions 102 and the wafers 94 is dominated by conduction through the fill gas 196. By way of non-limiting example, for a system processing wafers of 4-inch (100 mm) diameter, with pockets slightly larger than 100 mm in diameter, the flow rate of the fill gas 196 into each pocket is typically less than about 100 standard cubic centimeters per minute (cc/min). More generally, the flow rate into each pocket can range from about 20 cc/min to about 1000 cc/min.

Figure 12:
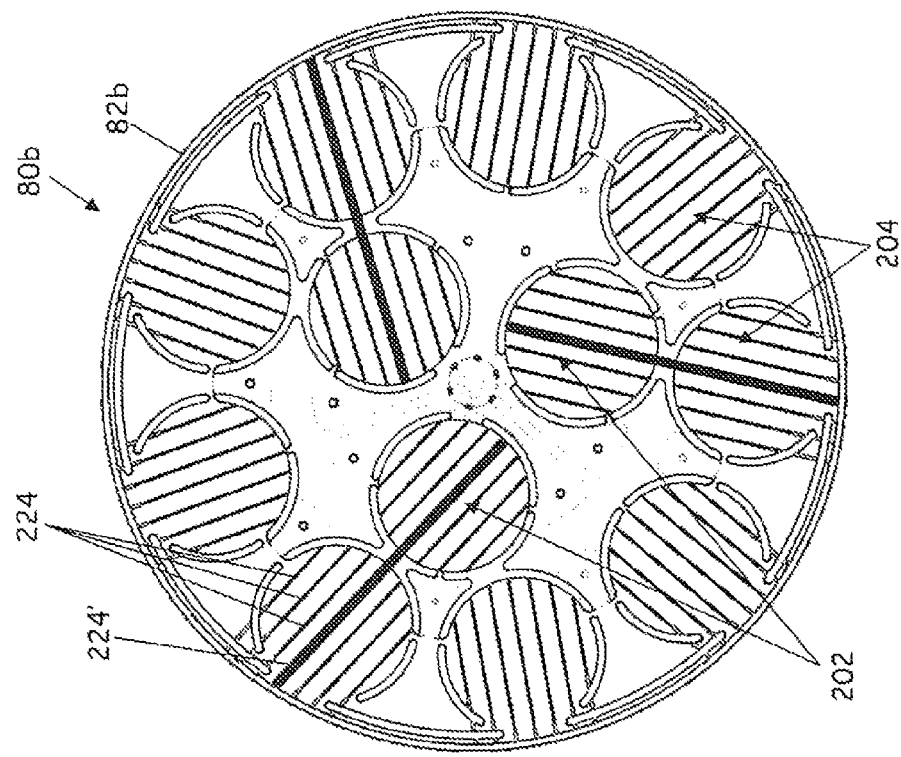
FIG. 12 is a plan sectional view of the wafer carrier of FIG. 11 at the axial location of the manifold passages.
Figure 11:
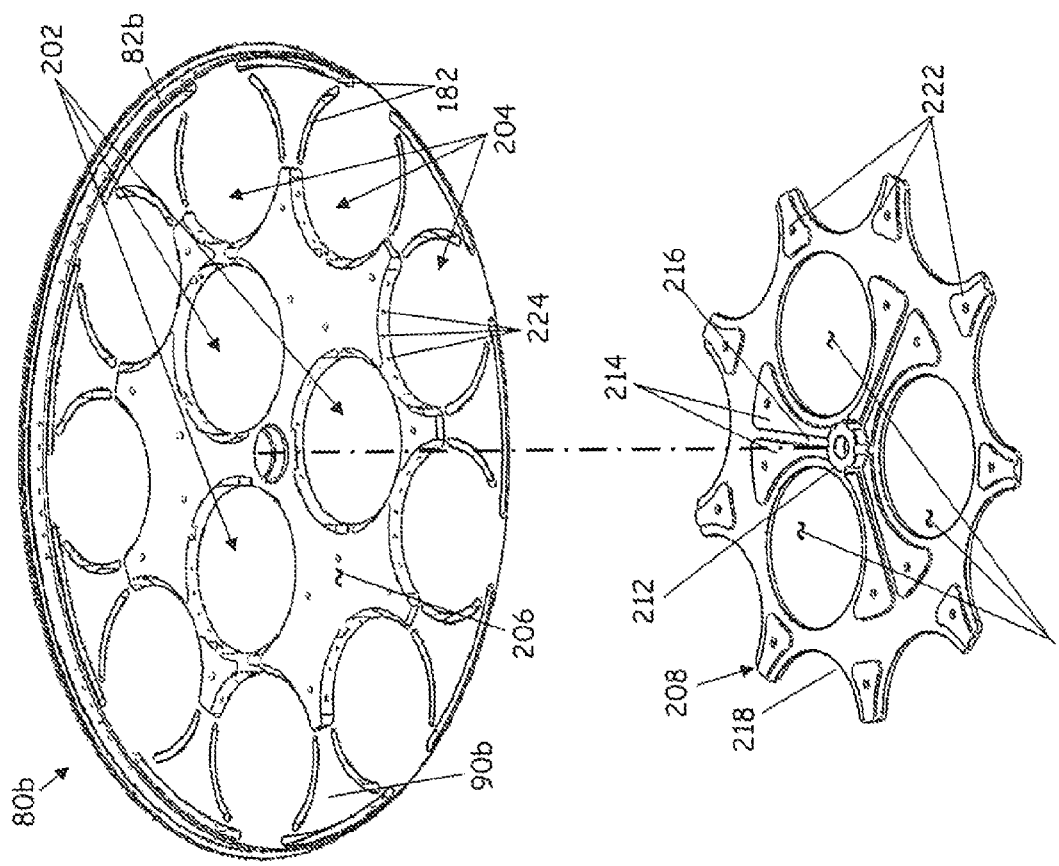
FIG. 11 is an isometric exploded view of a two-piece wafer carrier having interior and exterior pockets in an embodiment of the invention.

Referring to FIGS. 11 and 12, a two-piece wafer carrier 80b having interior pockets 202 and exterior pockets 204, the bottom views of which are is depicted in an embodiment of the invention. The two-piece wafer carrier 80b includes a body portion 82b having a bottom surface 90b and defining a plenum cavity 206. A closure portion 208 is disposed over and within the plenum cavity 206. The plenum cavity 206 is formed to define the radially inward-facing perimeters of the floor portions of the exterior pockets 204, and to define the perimeters floor portions of the interior pockets 202. The closure portion 208 includes many of the same aspects as the closure portion 98 of the two-piece wafer carrier 80a of FIGS. 3-10, including a hub portion 212, spacer portions 214 that define channels 216 and a contoured periphery 218. The closure portion 208 can also include peripheral spacer portions 222 that help maintain chamber spacing near the contoured periphery 218. The closure portion 208 further includes openings 220 to accommodate the interior pockets 202.

The fabrication process for forming manifold passages 224 is similar to that described for the two-piece wafer carrier 80a. The manifold passages 224 of the interior pockets 202 are formed extending the passages formed in an adjacent exterior pocket 204, as depicted in FIG. 12. Note that designated central manifold passages 224' (depicted with bold lines in FIG. 12) that pass through both an interior and an exterior pocket 202 and 204 are not aligned to pass through the central axis of the two-piece wafer carrier 80b, but instead is aligned to pass through the full diameter of both the respective interior and exterior pockets 202 and 204.

Figure 13:
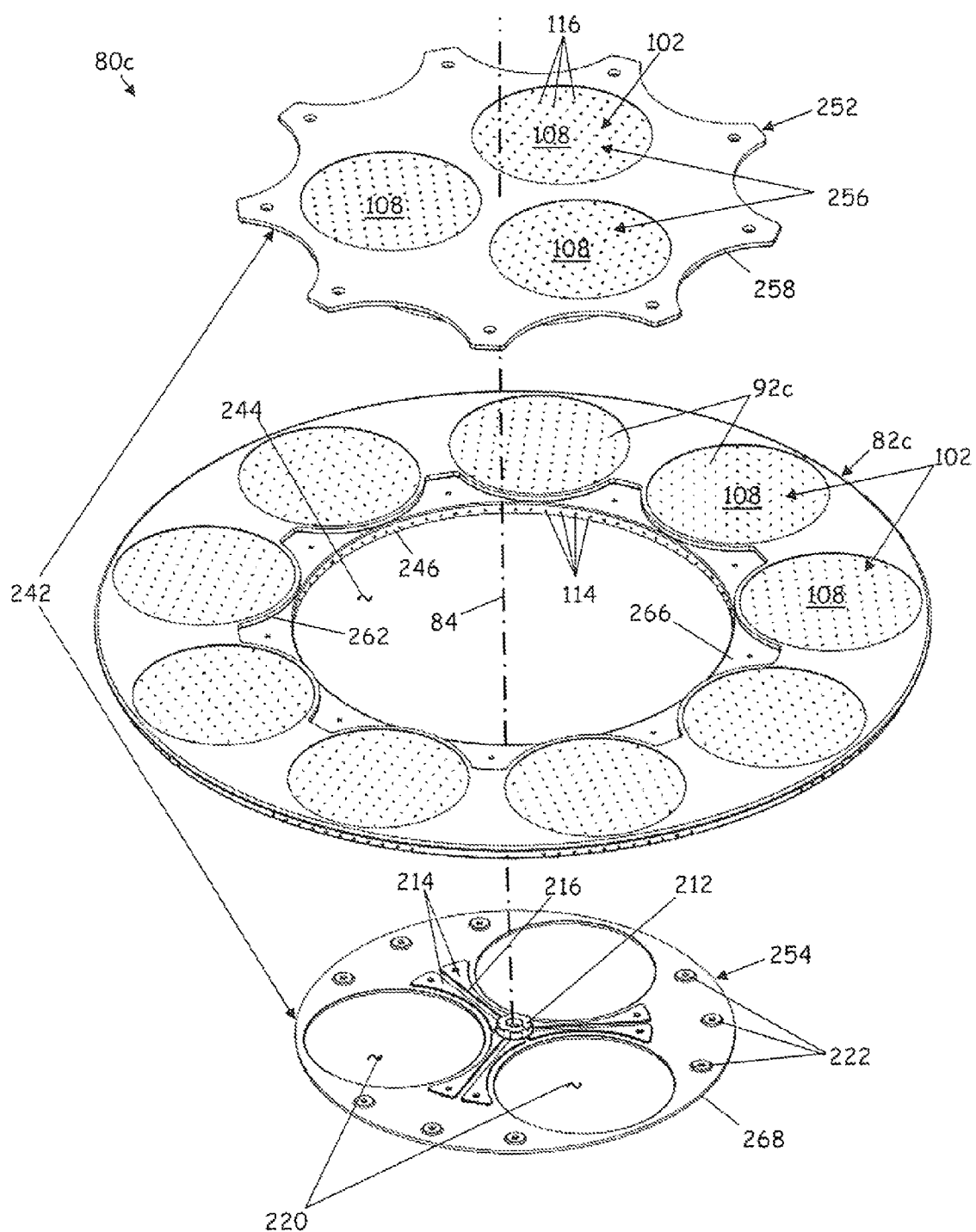
FIG. 13 is an exploded isometric view from an upper perspective of a three-piece wafer carrier in an embodiment of the invention.
Figure 14:
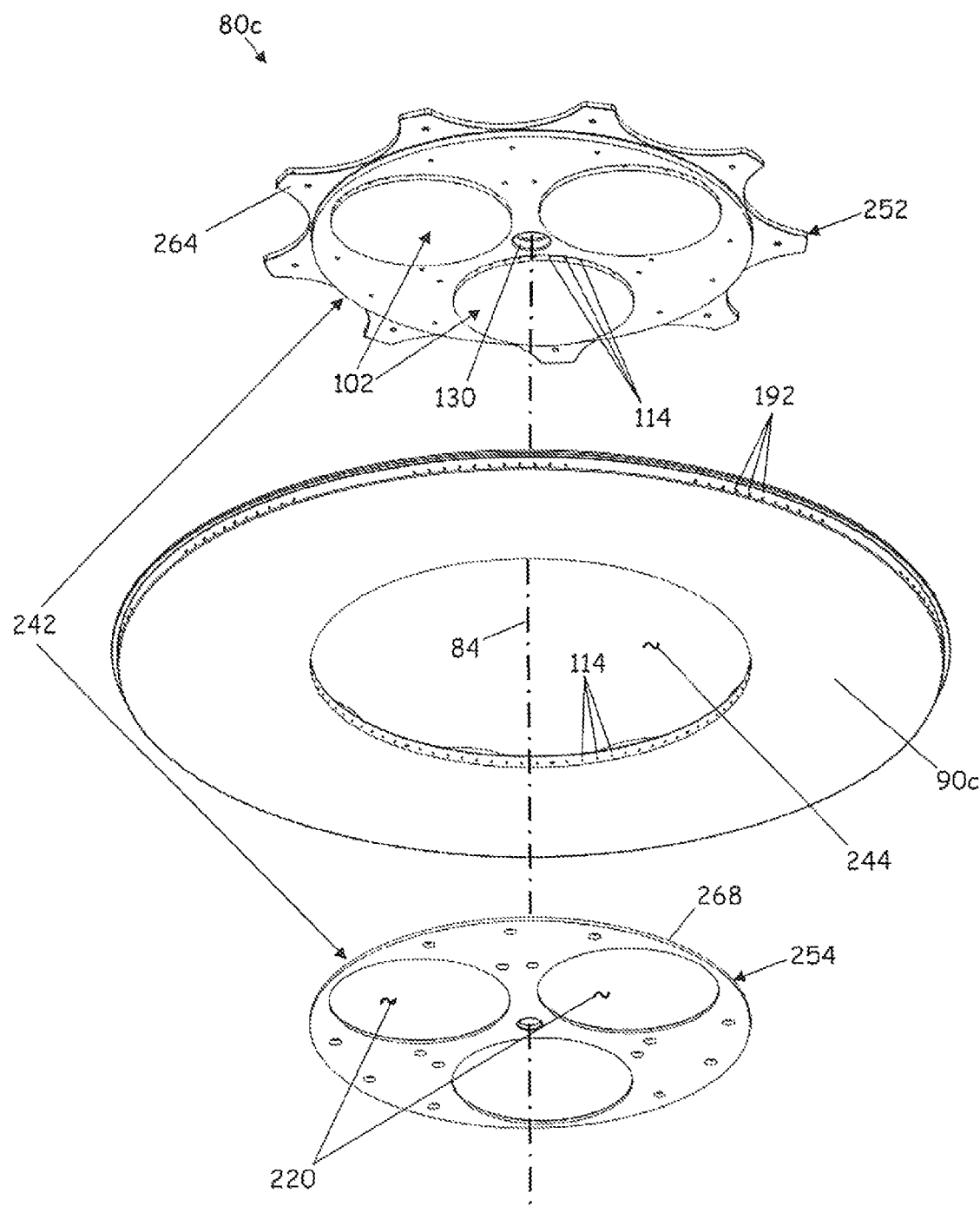
FIG. 14 is an exploded isometric view from a bottom perspective of the three-piece wafer carrier of FIG. 13.
Figure 15:
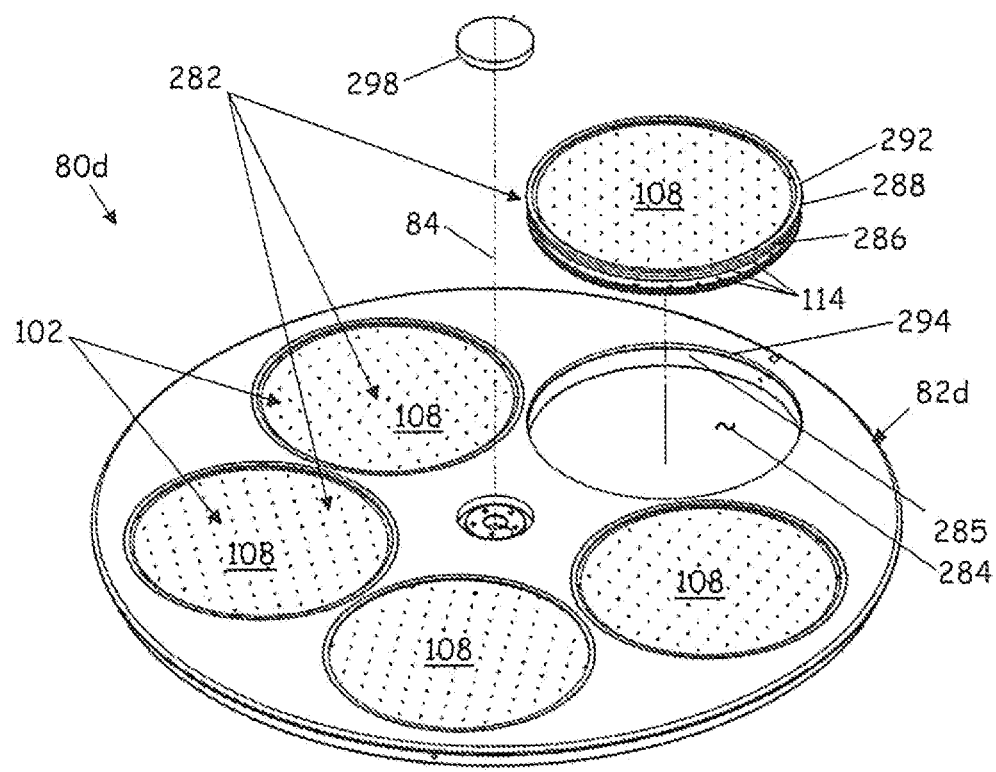
FIG. 15 is a partially exploded view from an upper perspective of a multiple plenum wafer carrier in an embodiment of the invention.

Referring to FIGS. 13 and 14, a three-piece wafer carrier 80c is depicted in an embodiment of the invention. The three-piece wafer carrier 80c includes an outer ring or body portion 82c with a bottom surface 90c and having wafer retention pockets 92c and a two-piece plenum structure 242. The outer ring portion 82c includes many features that are similar to the two-piece wafer carrier 80a and which are identified with like-numbered numerical references. Instead of a plenum cavity, the outer ring portion 82c defines an interior opening 244 bounded by a radially inward-facing perimeter 246. The manifold passages 114 pass through the radially inward-facing perimeter 246 to establish fluid communication with the interior opening 244.

The two-piece plenum structure 242 includes a top portion 252 and a bottom portion 254 that cooperate to define a plenum chamber therebetween. The top portion 252 includes a plurality of interior wafer retention pockets 256 that have the same features as the wafer retention pockets 92c. The top portion 252 further includes a contoured periphery 258 that substantially conforms to radially inward-facing peripheries 262 of the wafer retention pockets 92c. The contoured periphery 258 extends radially outward from the inward-facing perimeter 246 of the outer ring portion 82c to define a flange 264 on the top portion 252. The outer ring portion 82c includes a contoured recess 266 from the top surface 88a and proximate the inward-facing perimeter 246, the contoured recess 266 conforming to the shape and thickness of the flange 264.

The bottom portion 254 of the two-piece plenum structure 242 has generally the same features as the closure portion 208 of the two-piece wafer carrier 80b, the likenesses of which are similarly labeled in FIG. 13. One difference is that the outer periphery 268 of bottom portion 254 is not contoured to the shape of the floor portions 102 of the wafer retention pockets 92c, but rather for a close tolerance fit with the inward-facing perimeter 246.

In fabrication, both the top portion 252 and the bottom portion 254 of the two-piece plenum structure 242 can be treated on the interior surfaces in the same manner as the exterior surfaces to prevent bowing due the thermal expansion differences, as discussed above in relation to the closure portion 98 of the two-piece wafer carrier 80a. The manifold passages 114 for both the outer ring 82c and the top portion 252 of the two-piece plenum structure 242 can be formed using methods previously described.

In assembly, the top portion 252 of the two-piece plenum structure 242 is aligned with and disposed within the contoured recess 266 of the outer ring portion 82c. The top portion 252 can be affixed to the outer ring portion 82c using fasteners (not depicted) that pass through the flange 264. The bottom portion 254 is affixed to the top portion 252 to define a plenum chamber (not depicted) therebetween, the plenum chamber also being bounded by the inward-facing perimeter 246 of the outer ring portion 82c. It is noted that, for the embodiment of the three-piece wafer carrier 80c as depicted, there is no fixed order for the assembly. That is, the top and bottom portions 252 and 254 of the two-piece plenum structure 242 can be affixed to each other before or after the top portion 252 is joined to the outer ring 82c portion.

In operation, the three-piece wafer carrier 80c operates by the same principles as the two-piece wafer carriers 80a and 80b. The fill gas 196 flows over the hub portion 212 and into the channels 216 to flood the plenum chamber. The manifold passages 114 of the wafer retention pockets 92c and 256 are thereby sourced with the fill gas 196, which in turn sources the weep orifices 116.

It is noted that the three-piece wafer carrier 80c is depicted without thermal isolation slots (e.g., numerical references 182 and 184 of the two-piece wafer carriers 80a and 80b). It is recognized that thermal isolation slots can also be implemented into the three-piece wafer carrier 80c.

Referring to FIGS. 15 through 18, a multiple plenum wafer carrier 80d is depicted in an embodiment of the invention. The multiple plenum wafer carrier 80d includes a body portion 82d that defines a plurality of wafer retention pockets 282, one each disposed within a respective through aperture 284 formed on the body portion 82d. Each through aperture 284 is characterized as having an inner radial perimeter 285. The multiple plenum wafer carrier 80d includes many of the same aspects as the wafer carriers 80a, 80b and 80c which are identified with like-numbered numerical references.

Each wafer retention pocket 282 includes an outer radial perimeter 286 upon which a tangential channel 288 is formed. Each tangential channel 288 is in fluid communication with the manifold passages 114 of the respective wafer retention pocket 282. Each wafer retention pocket 282 can further include a flange or enlarged radius portion 292 formed on the outer radial perimeter 286 that mates within a recessed shoulder 294 formed on the respective through aperture 284.

Figure 18:
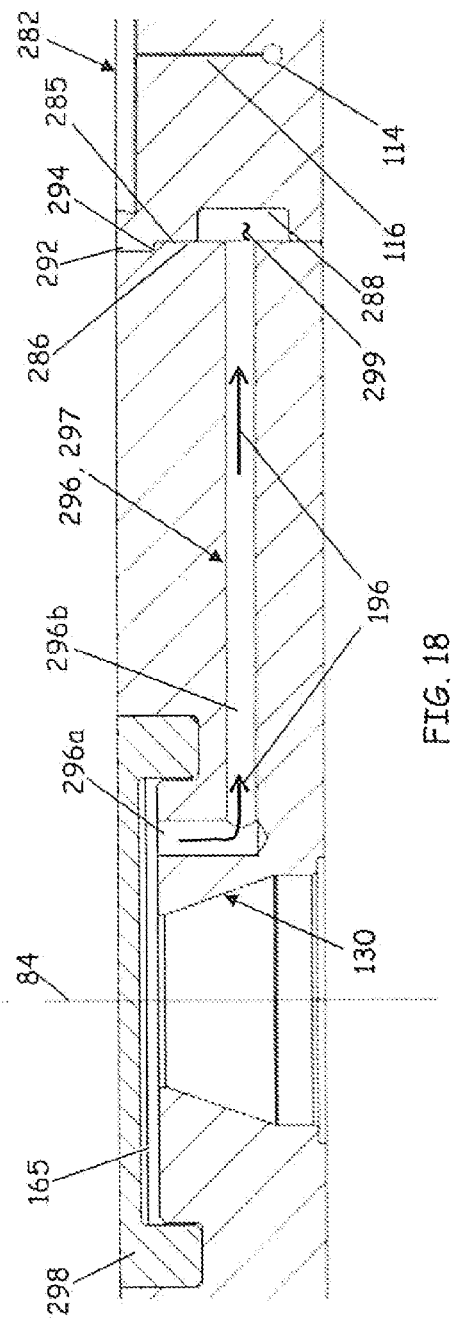
FIG. 18 is an enlarged partial sectional view of the multiple plenum wafer carrier of FIG. 15.

Each through aperture 284 can be placed in fluid communication with the gap 165 of the center receptacle 130 via a respective flow passage 296. In one embodiment, the flow passage 296 comprises a bored passageway 297. In one embodiment, each flow passage 296 includes an axially extending portion 296a that extends substantially parallel to the central axis 84 and a radially extending portion 296b that extends substantially normal to the central axis 84. During fabrication, the axially extending portions 296a can be formed as blind holes that extend from the top surface 88d (FIG. 18). A cap 298 can be placed over the axially extending portions 296a to define an upper boundary of the gap 165 and placing the gap 165 in fluid communication with the flow passages 296. The cap 298 can also enable a smooth upper surface 88d after any coating process is implemented on the multiple plenum wafer carrier 80d.

In reference to FIGS. 16A through 16C, alternative configurations of wafer retention pockets 282a through 282c, respectively, are depicted in embodiments of the invention. The wafer retention pockets 282a through 282c present weep orifices 16 that establish different patterns. Wafer retention pocket 282a (FIG. 16A) depicts the weep holes 116 as falling generally between a first radius R1 and a second radius R2, thus providing entry of the fill gas over a substantially annular region of the upper surface 108. Wafer retention pocket 282b (FIG. 16B) depicts the weep holes 116 as falling generally outside a first radius R1, thus providing entry of the fill gas over a substantially outer annular region of the upper surface 108. Wafer retention pocket 282c (FIG. 16C) depicts the weep holes 116 as falling generally within a rectangular pattern that is substantially centered on the upper surface 108.

While the various arrangements of the weep holes 116 are depicted and described in the context of the multiple plenum wafer carrier 80d, it is understood that differing arrangements of the weep hole pattern can be applied to any of the wafer carriers 80 described and depicted herein.

In assembly, each wafer retention pocket 282 is disposed in a respective one of the through apertures 284 so that the flange portion 292 rests on the recessed shoulder 294 of the respective through aperture. The tangential channel 288 cooperates with the inner radial perimeter 285 of the respective through aperture 284 to define a local plenum chamber 299 that surrounds the respective wafer retention pocket 282. In one embodiment, the manifold passages 114 are oriented substantially perpendicular to the radially extending portions 296b. The cap 298 is placed over the axially extending portions 296a.

The operational concept of the multiple plenum wafer carrier 80d is to source each wafer retention pocket 282 with the separate, local plenum chamber 299, best seen in FIG. 18. The fill gas 196 enters the gap 165, courses through the flow passage 296 and enters the local plenum chamber 299. The local plenum chamber 299 has a much larger hydraulic diameter than the manifold passages 114, and therefore substantially less resistance to flow than the manifold passages 114. The substantially lower resistance to flow enables the plenum chamber 299 to charge to a substantially uniform pressure, thus sourcing each of the manifold passages 114 in a substantially uniform manner. The fill gas 196 enters the manifold passages 114 to source the weep orifices 116, as in the other embodiments.

Orienting the manifold passages 114 perpendicular to the radially extending portions 296 of the respective flow passage 296 prevents impinging any of the manifold passages 114 directly, thus aiding in spreading the flow of the fill gas 196 as it enters the plenum chamber 299 and enhancing the equal pressure sourcing of the manifold passages 114. Also in the depicted embodiment of FIGS. 15-18, the manifold passages 114 pass entirely through the floor portions 103 of the wafer retention pockets 282, and are sourced from both ends, further reducing pressure gradients along the length of the manifold passages 114.

The local plenum chamber 299 surrounds the respective wafer retention pocket 282 with fill gas 196 that flows tangentially around the wafer retention pocket 282. The tangentially flowing fill gas 196 can act to thermally isolate the wafer retention pocket 282 from the body portion 82d, thus enhancing the temperature uniformity of the resident wafer. Accordingly, while thermal isolation slots 182, 184 of the two-piece wafer carriers 80a and 80b can be implemented into the multiple plenum wafer carrier 80d, the local plenum chamber 299 can provide the desired thermal isolation without need for thermal isolation slots.

The bodies 82 of the various wafer carriers 80 are preferably formed from materials that do not contaminate the reaction chamber 10 and can withstand the temperatures of operation. Typical materials include graphite, silicon carbide, or other refractory materials.

The following references, referred to above, are hereby incorporated by reference herein in their entirety except for the claims and express definitions included therein: U.S. Patent Application Publication No. 2011/0206843; U.S. Pat. No. 7,276,124; U.S. patent application Ser. No. 13/450,062; U.S. patent application Ser. No. 13/618,799.

References to "top," "bottom," "upper" and "lower" are used for ease of description, and do not necessarily refer to gravitational frame of reference. Rather, these terms refer to directions relative to and between the gas distribution element 12 and the wafer carrier 80. That is, the top end 13 of the reaction chamber 10 is typically, but not necessarily, disposed at the "top" of the chamber in the normal gravitational frame of reference. The "downward direction" as used herein refers to the direction away from the gas distribution element 12 toward the wafer carrier 80, with the "upward direction" being the direction opposite the downward direction, regardless of whether these directions are aligned with the gravitational vector. Similarly, "top" or "upper" surfaces describe surfaces that face in the upward direction, and "bottom" or "lower" surfaces describe surfaces that face in the downward direction as defined.

All of the features disclosed in this specification (including any accompanying claims, abstract and drawings), and/or all of the steps of any method or process so disclosed, can be combined in any combination, except combinations where at least some of such features and/or steps are mutually exclusive.

Each feature disclosed in this specification (including any accompanying claims, abstract and drawings) can be replaced by alternative features serving the same, equivalent or similar purpose, unless expressly stated otherwise. Thus, unless expressly stated otherwise, each feature disclosed is one example only of a generic series of equivalent or similar features.

For purposes of interpreting the claims for the present invention, it is expressly intended that the provisions of Section 112, sixth paragraph of 35 U.S.C. are not to be invoked unless the specific terms "means for" or "step for" are recited in the subject claim.

What is claimed is:

1. A wafer carrier for use in a system for growing epitaxial layers on a plurality of wafers by chemical vapor deposition, said wafer carrier comprising:
    a body portion formed symmetrically about a central axis, said body portion including generally planar top and bottom surfaces that are substantially perpendicular to said central axis;
    a plurality of wafer retention pockets recessed relative to said top surface of said body portion, each of said wafer retention pockets including a floor portion having an upper surface generally parallel to said top surface of said body portion;
    a center receptacle recessed relative to said bottom surface of said body portion, said center receptacle being concentric with said central axis;
    a plurality of flow passages extending radially outward from and being in fluid communication with said center receptacle;
    a plenum chamber defined within said body portion, said plenum chamber defining a single fluid passageway in fluid communication with, and surrounding, said plurality of flow passages;
    a plurality of manifold passages in fluid communication with said plenum chamber, said manifold passages having an orientation that is substantially parallel with said top surface of said body portion of said wafer carrier and extending underneath said surface of said floor portion of one of said plurality of wafer retention pockets; and
    a plurality of weep orifices formed in said floor portion of said one of said plurality of wafer retention pockets, each of said weep orifices being in fluid communication with one of said plurality of manifold passages and passing through said upper surface of said floor portion of said wafer retention pocket.

2. The wafer carrier of claim 1 wherein each of said plurality of weep orifices are oriented substantially parallel with said central axis.

3. The wafer carrier of claim 1, wherein each wafer retention pocket includes a plurality of parallel manifold passages.

4. The wafer carrier of claim 1, wherein said plenum chamber has a first hydraulic diameter and each of said manifold passages have a second hydraulic diameter, wherein a ratio said first hydraulic diameter to said second hydraulic diameter is within a range of about 2 to about 100.

5. The wafer carrier of claim 1, wherein each of said manifold passages have a second hydraulic diameter and each of said weep orifices have a third hydraulic diameter, wherein a ratio of said second hydraulic diameter to said third hydraulic diameter is in within a range of about unity to about 50.

6. The wafer carrier of claim 1, wherein each of said wafer retention pockets is at least partially surrounded by a thermal isolation slot, said thermal isolation slot being defined in and recessed from said bottom surface of said wafer carrier.

7. The wafer carrier of claim 1, wherein said single plenum chamber is defined by a plenum cavity formed in a central region of said body portion and a closure portion disposed within said plenum cavity, said plenum cavity being in fluid communication with said plurality of manifold passages.

8. The wafer carrier of claim 7, wherein said plenum cavity is recessed from said bottom surface of said body portion.

9. The wafer carrier of claim 7, wherein said closure portion and said plenum cavity include structure that cooperates to define said flow passages.

10. The wafer carrier of claim 7, wherein said single plenum chamber is defined by a two-piece plenum structure, said two-piece plenum structure being disposed within said body portion of said wafer carrier.

11. A wafer carrier for use in a system for growing epitaxial layers on a plurality of wafers by chemical vapor deposition, said wafer carrier comprising:
    a body portion formed symmetrically about a central axis, said body portion including generally planar top and bottom surfaces that are substantially perpendicular to said central axis;
    a plurality of wafer retention pockets recessed relative to said top surface of said body portion, each of said wafer retention pockets including a floor portion having an upper surface generally parallel to said top surface of said body portion;
    a center receptacle recessed relative to said bottom surface of said body portion, said center receptacle being concentric with said central axis;

means for distributing a fill as from said center receptacle to said wafer retention pockets, wherein said means for distributing said fill gas includes a plenum chamber defined within said body portion, said plenum chamber defining a single fluid passageway in fluid communication with, and surrounding, said means for distributing said fill gas.

12. The wafer carrier of claim 11, wherein said means for distributing said fill gas include means for restricting gas flow from said plenum chamber.

13. The wafer carrier of claim 11, wherein said plurality of wafer retention pockets includes thermal isolation means.

14. The wafer carrier of claim 11, wherein said plenum chamber includes a plenum cavity and a closure portion disposed within said plenum cavity, said plenum cavity being in fluid communication with said means for distributing said fill gas.

15. The wafer carrier of claim 11, wherein said plenum chamber is recessed from said bottom surface of said body portion.

16. The wafer carrier of claim 11, wherein said plenum chamber includes a two-piece structure, said two-piece structure being disposed within said body portion of said wafer carrier.

\* \* \* \* \*